(12) United States Patent
Amikura et al.

(10) Patent No.: US 10,096,495 B2
(45) Date of Patent: Oct. 9, 2018

(54) SUBSTRATE PROCESSING APPARATUS

(71) Applicant: TOKYO ELECTRON LIMITED, Tokyo (JP)

(72) Inventors: Manabu Amikura, Nirasaki (JP); Toshiki Hinata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 305 days.

(21) Appl. No.: 14/971,708

(22) Filed: Dec. 16, 2015

(65) Prior Publication Data

US 2016/0189987 A1    Jun. 30, 2016

(30) Foreign Application Priority Data

Dec. 26, 2014   (JP) .................. 2014-264550
Sep. 17, 2015   (JP) .................. 2015-183561

(51) Int. Cl.
| | |
|---|---|
| *C23F 1/00* | (2006.01) |
| *H01L 21/67* | (2006.01) |
| *H01J 37/32* | (2006.01) |
| *C23C 16/44* | (2006.01) |
| *C23C 16/455* | (2006.01) |

(52) U.S. Cl.
CPC .... *H01L 21/67069* (2013.01); *C23C 16/4404* (2013.01); *C23C 16/4409* (2013.01);
(Continued)

(58) Field of Classification Search
CPC ........ C23C 16/4404–16/4409; C23C 16/4412; C23C 16/45587; C23C 16/45589;
(Continued)

(56) References Cited

U.S. PATENT DOCUMENTS 8,513,097 B2   8/2013   Iwai
2007/0281085 A1   12/2007   Devine et al.
(Continued)

FOREIGN PATENT DOCUMENTS

JP    4265839 B2    1/2001
JP    2007-214513 A   8/2007
(Continued)

*Primary Examiner* — Gordon Baldwin
*Assistant Examiner* — Mirza Israr Javed
(74) *Attorney, Agent, or Firm* — Nath, Goldberg & Meyer; Jerald L. Meyer (57) ABSTRACT

A substrate processing apparatus includes a processing container configured to air-tightly accommodate substrates, a plurality of mounting stands configured to mount the substrates, a process gas supply part configured to supply a process gas to the mounting stands, an exhaust mechanism configured to evacuate an interior of the processing container, a partition wall configured to independently surround the mounting stands with a gap left between the partition wall and each of the mounting stands, and cylindrical inner walls configured to independently surround the mounting stands with a gap left between each of the inner walls and each of the mounting stands. Slits are formed in the inner walls. The process gas in the processing spaces is exhausted via the slits. The inner walls include partition plates for bypassing the process gas so that the process gas does not directly flow into the slits.

3 Claims, 5 Drawing Sheets (52) U.S. Cl.
CPC .. *H01J 37/32449* (2013.01); *H01L 21/67017* (2013.01); *H01L 21/6719* (2013.01); *C23C 16/4412* (2013.01); *C23C 16/45587* (2013.01); *H01J 2237/0268* (2013.01); *H01J 2237/16* (2013.01)

(58) Field of Classification Search
CPC ............... C23C 16/45591; H01L 21/67; H01L 21/6719; H01J 37/32449; H01J 37/32477–37/32513; H01J 37/32633; H01J 37/32816; H01J 37/32871; H01J 37/32889–37/32899; H01J 2237/16; H01J 2237/0268
USPC .................................................. 118/715, 720
See application file for complete search history.

(56) References Cited

U.S. PATENT DOCUMENTS

| | | | |
|---|---|---|---|
| 2008/0011424 A1* | 1/2008 | Yin | ................... H01J 37/32091 156/345.48 |
| 2008/0217293 A1 | 9/2008 | Iimuro | |
| 2010/0211203 A1 | 8/2010 | Oka et al. | |
| 2012/0000612 A1 | 1/2012 | Odagiri et al. | |
| 2012/0211351 A1 | 8/2012 | Tomyo | |
| 2013/0065396 A1 | 3/2013 | Dhindsa et al. | |
| 2013/0276983 A1 | 10/2013 | Park et al. | |
| 2014/0209240 A1 | 7/2014 | Matsuzaki et al. | |

FOREIGN PATENT DOCUMENTS

| | | | |
|---|---|---|---|
| JP | 2010520649 A | 6/2010 |
| JP | 2012015285 A | 1/2012 |

* cited by examiner

SUBSTRATE PROCESSING APPARATUS

CROSS-REFERENCE TO RELATED APPLICATION

This application claims the benefit of Japanese Patent Application No. 2014-264550, filed on Dec. 26, 2014, and Japanese Patent Application No. 2015-183561, filed on Sep. 17, 2015, in the Japan Patent Office, the disclosures of which are incorporated herein in their entireties by reference.

TECHNICAL FIELD

The present disclosure relates to a substrate processing apparatus which performs substrate processing using a predetermined process gas.

BACKGROUND

In recent years, along with the miniaturization of a semiconductor device, a method capable of performing fine etching, which is called a chemical oxide removal (COR) process, is used instead of the conventional etching technique such as dry etching or wet etching.

The COR process is a process that generates a product within a processing container kept at vacuum by, for example, supplying a process gas to a semiconductor wafer (hereinafter referred to as a "wafer") as an object to be processed and causing the process gas to react with a film formed on the wafer. The product generated on a wafer surface by the COR process is sublimated by subjecting the product to heating at a subsequent step. Thus, the film on the wafer surface is removed.

The COR process is performed by a single-wafer-type processing apparatus which processes a wafer one by one. In recent years, for the purpose of enhancing the throughput, a processing apparatus which processes a plurality of wafers at the same time is often used.

In this processing apparatus, a baffle plate which divides the interior of a processing container into a processing space and an exhaust space is installed in order to prevent a flow of a process gas from becoming non-uniform on the surfaces of a plurality of, e.g., two, wafers.

However, a demand for the uniformity of wafer processing grows strict in recent years. In the aforementioned processing apparatus which processes a plurality of wafers at the same time, it is difficult to secure the uniformity of a process gas on the respective wafer surfaces.

Furthermore, in the processing apparatus which processes a plurality of wafers at the same time, there is a request for parallel processing of the respective wafers with independent recipes. It is also desired to form independent processing spaces for the respective wafers.

SUMMARY

Some embodiments of the present disclosure provide a substrate processing apparatus capable of independently processing a plurality of substrates having in-plane uniformity within a processing container.

According to the embodiments of the present disclosure, there is provided a substrate processing apparatus for processing substrates, including: a processing container configured to air-tightly accommodate the substrates; a plurality of mounting stands configured to mount the substrates within the processing container; a process gas supply part configured to supply a process gas from above the mounting stands toward the mounting stands; an exhaust mechanism configured to evacuate an interior of the processing container; a partition wall disposed within the processing container and configured to independently surround the mounting stands with a gap left between the partition wall and an outer periphery of each of the mounting stands; an elevator mechanism configured to move the partition wall up and down between a retracted position and a substrate processing position; and cylindrical inner walls disposed on a bottom surface of the processing container and configured to independently surround the mounting stands with a gap left between each of the inner walls and the outer periphery of each of the mounting stands, wherein substrate processing spaces are formed by the partition wall and the inner walls as the partition wall is moved to the substrate processing position, slits are formed in the inner walls, the process gas existing within the processing spaces is exhausted via the slits, and the inner walls are provided with partition plates configured to bypass the process gas existing within the processing spaces so that the process gas does not directly flow into the slits.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Embodiments of the present disclosure will now be described with reference to the accompanying drawings. In the subject specification and the drawings, components substantially identical in function and configuration will be designated by like reference symbols with duplicate descriptions thereof omitted. Further. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
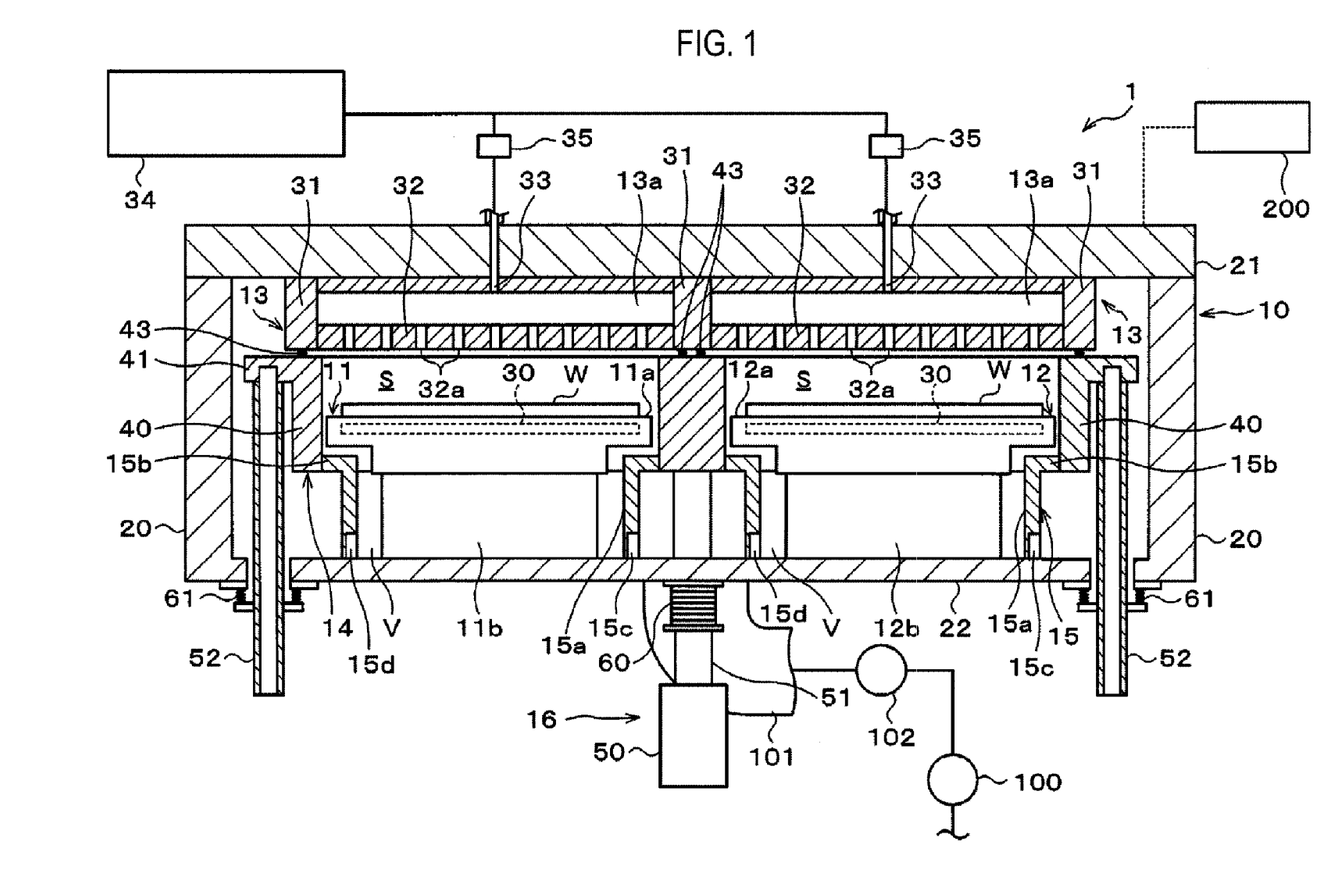
FIG. 1 is a vertical sectional view schematically illustrating the configuration of a substrate processing apparatus according to one embodiment.

FIG. 1 is a vertical sectional view schematically illustrating the configuration of a wafer processing apparatus 1 as a substrate processing apparatus according to one embodiment. In the present embodiment, descriptions will be made, by way of example, on a case where the wafer processing apparatus 1 is, e.g., a COR processing apparatus which performs a COR process with respect to a wafer W.

For example, as illustrated in FIG. 1, the wafer processing apparatus 1 includes a hermetically sealed processing container 10, a plurality of (two, in the present embodiment) mounting stands 11 and 12 configured to mount wafers W within the processing container 10, a shower head 13 as a process gas supply part configured to supply a process gas from the upper side of the mounting stands 11 and 12 toward the mounting stands 11 and 12, a vertically movable partition wall 14 configured to surround the outer surfaces of the respective mounting stands 11 and 12, inner walls 15 fixed to the bottom portion of the processing container 10 and configured to independently surround the outer surfaces of the respective mounting stands 11 and 12, and an elevator mechanism 16 configured to vertically move the partition wall 14.

The processing container 10 is a container made of, e.g., metal such as aluminum or stainless steel and having, e.g., a substantially rectangular shape as a whole. The processing container 10 includes a cylindrical sidewall 20 having, e.g., a substantially rectangular plan-view shape and having an open upper surface and an open lower surface, a top plate 21 configured to air-tightly cover the upper surface of the sidewall 20, and a bottom plate 22 configured to cover the lower surface of the sidewall 20. A seal member (not illustrated) configured to keep the interior of the processing container 10 air-tight is installed between the upper end surface of the sidewall 20 and the top plate 21.

The mounting stands 11 and 12 are formed into a substantially cylindrical shape. Each of the mounting stands 11 and 12 includes an upper stand 11a or 12a provided with a mounting surface for mounting a wafer W thereon, and a lower stand 11b and 12b fixed to the bottom plate 22 and configured to support the upper stand 11a or 12a. A temperature adjusting mechanism 30 configured to adjust the temperature of the wafer W is installed within the upper stand 11a or 12a. The temperature adjusting mechanism 30 is configured to circulate a cooling medium. e.g., water, thereby adjusting the temperature of the mounting stand 11 and controlling the temperature of the wafer W mounted on the mounting stand 11. The mounting stand 11 and the mounting stand 12 have the same configuration as set forth above. Hereinafter, the descriptions on the mounting stand 11 will be equally applied to the mounting stand 12 unless specifically mentioned otherwise. Therefore, descriptions on the mounting stand 12 will be omitted.

A support pin unit (not illustrated) is installed in the bottom plate 22 under the mounting stand 11 and is configured to deliver a wafer W between the support pin unit and a transfer mechanism (not illustrated) installed outside the wafer processing apparatus 1.

The shower heads 13 are individually installed on the lower surface of the top plate 21 of the processing container 10 so as to face the mounting stand 11 and the mounting stand 12, respectively. The shower head 13 includes a substantially cylindrical frame 31 having an open lower surface and supported on the lower surface of the top plate 21, and shower plates 32 having a substantially disc-like shape and fitted to the inner surface of the frame 31. The shower plates 32 are spaced apart by a predetermined distance from the ceiling portion of the frame 31. Thus, spaces 13a are formed between the ceiling portion of the frame 31 and the upper surfaces of the shower plates 32. Furthermore, a plurality of holes 32a extending through the shower plates 32 in the thickness direction is formed in the shower plates 32.

A gas supply source 34 is connected to the spaces 13a between the ceiling portion of the frame 31 and the shower plates 32 via gas supply pipes 33. The gas supply source 34 is configured to supply a process gas, e.g., a hydrogen fluoride (HF) gas or an ammonia ($NH_3$) gas. Thus, the process gas supplied from the gas supply source 34 is supplied toward the wafers W mounted on the respective mounting stands 11 and 12, via the spaces 13a and the shower plates 32. Furthermore, flow rate regulating mechanisms 35 configured to regulate the supply amount of the process gas are installed in the gas supply pipes 33. The flow rate regulating mechanisms 35 are configured to independently control the amounts of the process gas supplied to the respective wafers W. Alternatively, the shower head 13 may be, e.g., a post-mix-type shower head capable of independently supplying plural kinds of process gases without mixing the process gases.

Figure 2:
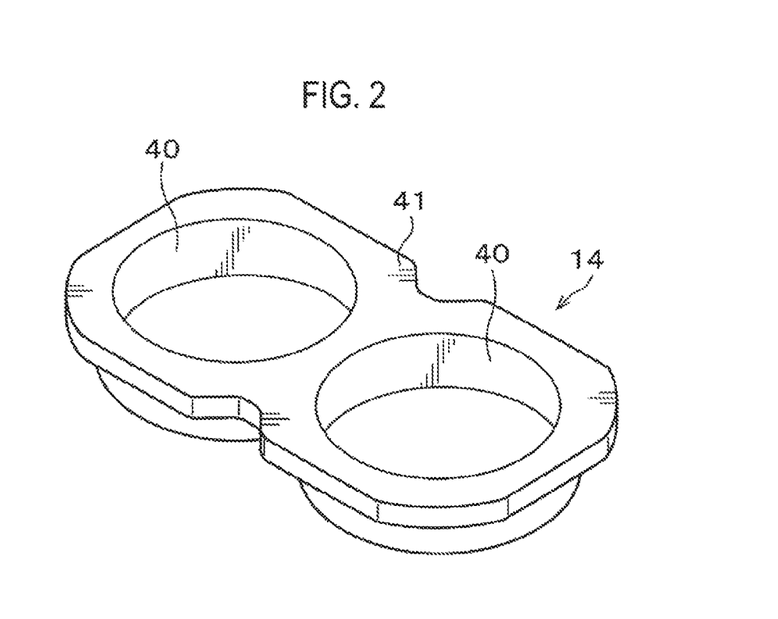
FIG. 2 is a perspective view schematically illustrating the configuration of a partition wall.

For example, as illustrated in FIG. 2, the partition wall 14 includes two cylinder portions 40 configured to independently surround the two mounting stands 11 and 12, and a flange portion 41 formed in the upper end portions of the cylinder portions 40. The inner diameter of each of the cylinder portions 40 is set larger than the outer diameter of the mounting stand 11 so that a gap is formed between each of the cylinder portions 40 and the mounting stand 11.

On the upper surface of the flange portion 41, seal members 43, e.g., O-rings, which air-tightly close the gap between the flange portion 41 and the frame 31 when the partition wall 14 is moved up by the elevator mechanism 16 to bring the flange portion 41 into contact with the frame 31 as illustrated in FIG. 1, are installed in a corresponding relationship with the respective mounting stands 11 and 12. By moving the partition wall 14 upward and bringing the frame 31 and the seal members 43 into contact with each other, a processing space S surrounded by the mounting stand 11, the partition wall 14 and the shower head 13 is formed.

Figure 3:
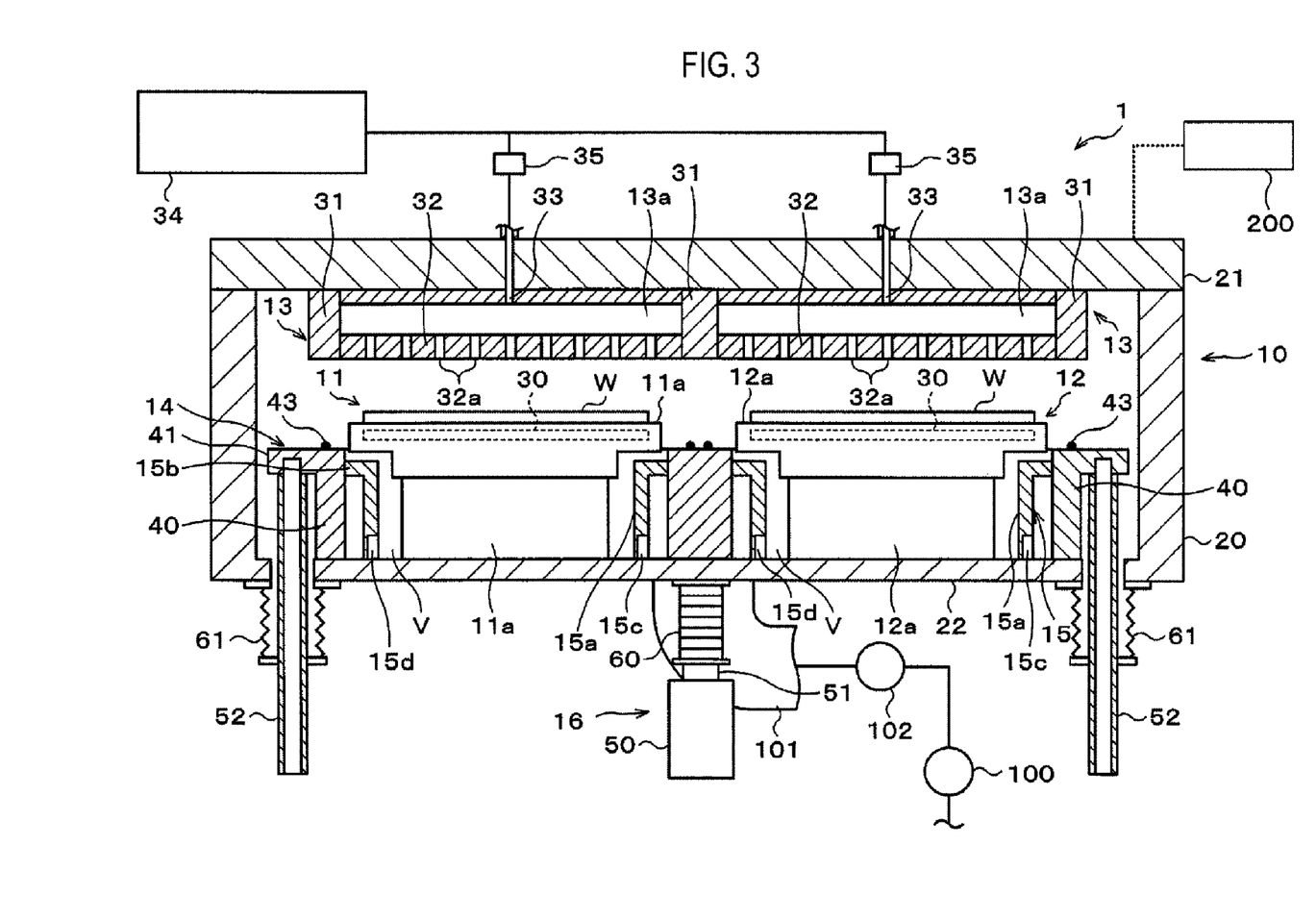
FIG. 3 is a vertical sectional view schematically illustrating the configuration of the substrate processing apparatus shown in FIG. 1, in which a partition wall is moved down to a retracted position.

The height of the partition wall 14 is set such that, when the partition wall 14 is moved down by the elevator mechanism 16 as illustrated in FIG. 3, the upper surface of the flange portion 41 is positioned, for example, lower than the upper surface of the mounting stand 11. Thus, by moving the partition wall 14 downward, it becomes possible to gain access to the wafers W from the outside of the processing container 10. The position in which the flange portion 41 of the partition wall 14 makes contact with the frame 31 (in which the processing space S is formed) will be often referred to as a "wafer processing position." The position in which the partition wall 14 is moved down to the vicinity of the bottom plate 22 or moved down into contact with the bottom plate 22 will be often referred to as a "retracted position." FIG. 1 illustrates a state in which the partition wall 14 is placed in the wafer processing position. FIG. 3 illustrates a state in which the partition wall 14 is placed in the retracted position.

The inner wall 15 includes a substantially cylindrical body portion 15a and a protrusion member 15b formed in the upper end portion of the body portion 15a so as to horizontally protrude radially outward. For example, as illustrated in FIG. 1, the inner wall 15 is disposed so as to surround each of the lower stands 11b and 12b of the mounting stands 11 and 12. The inner diameter of the body portion 15a of the inner wall 15 is set larger than the outer diameter of each of the lower stands 11b and 12b. Thus, an exhaust space V is formed between the inner wall 15 and each of the lower stands 11b and 12b. The height of the inner wall 15 is set such that, when the partition wall 14 is moved up to the wafer processing position by the elevator mechanism 16 as illustrated in FIG. 1, the protrusion member 15b of the inner wall 15 makes contact with the inner surface of the cylinder portion 40 of the partition wall 14. Thus, the inner wall 15 and the partition wall 14 make air-tight contact with each other.

A plurality of slits (slit outlets) 15c is formed in the lower portion of each of the inner walls 15. Details of the configuration of the slits 15c will be described later.

The elevator mechanism 16 configured to move the partition wall 14 up and down includes an actuator 50 disposed outside the processing container 10, a drive shaft 51 connected to the actuator 50 and extending vertically upward into the processing container 10 through the bottom plate 22, and a plurality of guide shafts 52 each having one end connected to the partition wall 14 and the other end portion extending to the outside of the processing container 10. The guide shafts 52 serve to prevent the partition wall 14 from being tilted when the partition wall 14 is moved up and down by the drive shaft 51.

The lower end of an extendible bellows 60 is air-tightly connected to the drive shaft 51. The upper end of the bellows 60 is air-tightly connected to the lower surface of the bottom plate 22. Thus, when the drive shaft 51 is moved up and down, the bellows 60 is extended and contracted along the vertical direction, whereby the interior of the processing container 10 is kept air-tight. In addition, a sleeve (not illustrated) fixed to, e.g., the bottom plate 22 and configured to serve as a guide during the up/down movement is installed between the drive shaft 51 and the bellows 60.

Similar to the drive shaft 51, an extendible bellows 61 is connected to each of the guide shafts 52. The upper end portion of the bellows 61, which is located below the bottom plate 22 and the sidewall 20, is air-tightly connected to the bottom plate 22 and the sidewall 20. Thus, when each of the guide shafts 52 is moved up and down along with the up/down movement of the partition wall 14 by the drive shaft 51, the bellows 61 is extended and contracted along the vertical direction, whereby the interior of the processing container 10 is kept air-tight. Similar to the case of the drive shaft 51, a sleeve (not illustrated) configured to serve as a guide during the up/down movement is installed between each of the guide shafts 52 and the bellows 61.

The upper end portion of the bellows 61 is a fixed end. The lower end portion of the bellows 61 connected to each of the guide shafts 52 is a free end. Therefore, if the internal pressure of the processing container 10 becomes negative, a force tending to compress the bellows 61 in the vertical direction acts on the bellows 61 due to the pressure difference between the interior and exterior of the bellows 61. Thus, each of the guide shafts 52 connected to the free end of the bellows 61 is moved vertically upward by the contraction of the bellows 61. Consequently, the partition wall 14 is moved up in a balanced manner and the seal members 43 are appropriately brought into contact with the frame 31. This makes it possible to secure sealability between the partition wall 14 and the frame 31. A force tending to push each of the guide shafts 52 downward acts on each of the guide shafts 52 due to the reaction force of the bellows 61 as an elastic member or the own weight of each of the guide shafts 52. However, the differential pressure acting on each of the guide shafts 52 may be adjusted by appropriately setting the diameter of the bellows 61.

An exhaust mechanism 100 configured to evacuate the interior of the processing container 10 is connected to the bottom plate 22 at the outer side of the inner walls 15 via an exhaust pipe 101. A regulating valve 102 configured to regulate the exhaust amount in the exhaust mechanism 100 is installed in the exhaust pipe 101. Furthermore, pressure measuring instruments (not illustrated) for measuring the pressures of the processing spaces S of the mounting stands 11 and 12 are installed in the bottom plate 22. The opening degree of the regulating valve 102 is controlled based on, for example, the measurement values measured by the pressure measuring instruments.

As illustrated in FIG. 1, a control device 200 is installed in the wafer processing apparatus 1. The control device 200 is, for example, a computer, and includes a program storage part (not illustrated). A program configured to control the processing of the wafers W in the wafer processing apparatus 1 is stored in the program storage part. The program is stored in a computer-readable storage medium such as, e.g., a hard disk (HD), a flexible disk (FD), a compact disk (CD), a magneto-optical disk (MO) or a memory card. The program may be installed from the storage medium into the control device 200.

Figure 4:
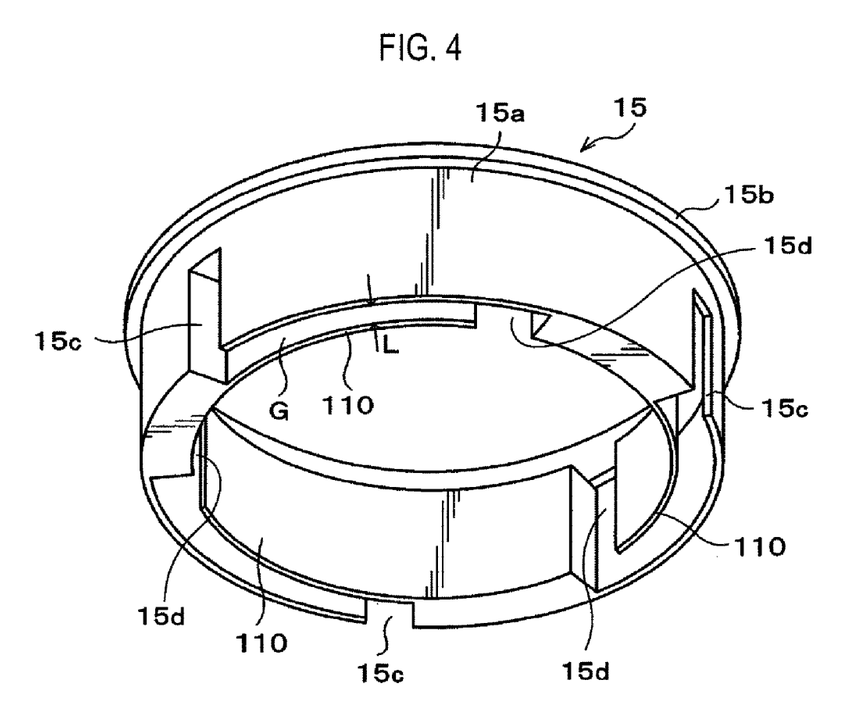
FIG. 4 is a perspective view schematically illustrating the configuration of an inner wall.
Figure 5:
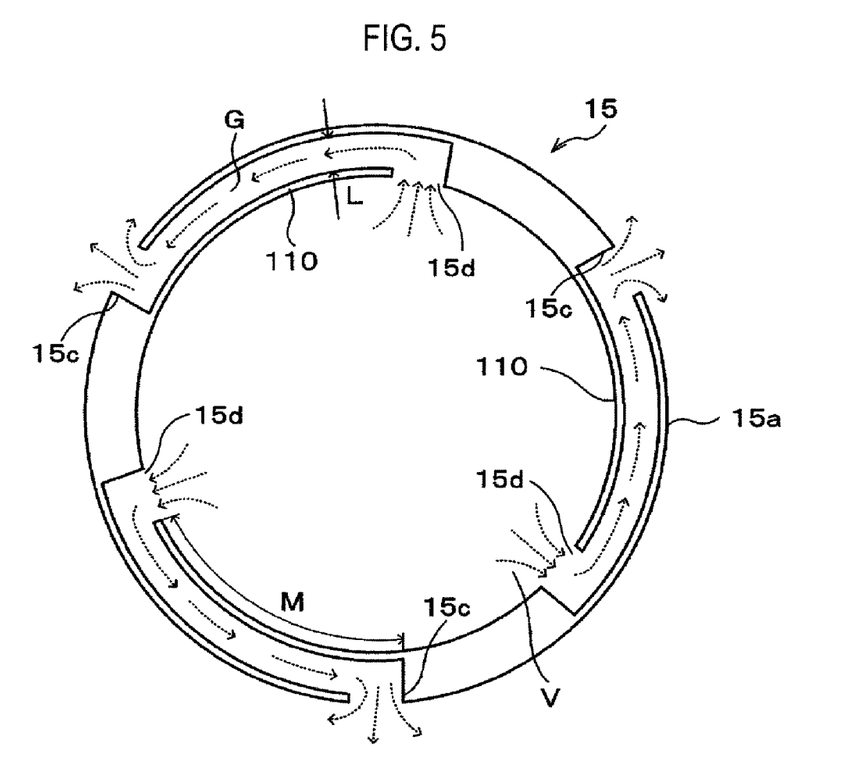
FIG. 5 is a horizontal sectional view schematically illustrating the configuration of an inner wall.

Next, the configuration of the inner wall 15 in the vicinity of the slits 15c will be described with reference to FIGS. 4 and 5. FIG. 4 is a bottom perspective view schematically illustrating the configuration of the inner wall 15. FIG. 5 is a horizontal sectional view of the inner wall 15.

As illustrated in FIGS. 4 and 5, the respective slits 15c are disposed at regular intervals along the circumferential direction of the inner wall 15. In the vicinity of the respective slits 15c, partition plates 110 having a substantially arc-like shape are installed inside the body portion 15a. In FIGS. 4 and 5, there is installed a state in which the slits 15c and the partition plates 110 are respectively formed at three points along the circumferential direction.

The partition plates 110 are disposed on a circle substantially concentric with the body portion 15a so that a gap G having a predetermined width L is formed between the partition plates 110 and the body portion 15a. The width L of the gap G is substantially uniform in the longitudinal direction of the partition plates 110. In the present embodiment, the width L of the gap G is set at about 13.5 mm. Furthermore, the height of the slits 15c is set at about 60 mm.

The partition plates 110 are disposed so that, when horizontally observing the slits 15c from the center of the inner wall 15, the slits 15c are covered by the partition plates 110 and are not visually recognized. Thus, the process gas supplied from the shower head 13 and moved into the exhaust space V of the inner wall 15 via the processing space S is not directly introduced into the slits 15c at the shortest distance but is introduced through a slit inlet 15d and exhausted from the slits 15c via the gap G between the partition plates 110 and the body portion 15a, for example, as indicated by broken-line arrows in FIG. 5. That is to say, the partition plates 110 bypass the process gas existing in the exhaust space V so that the process gas is introduced through the slit inlet 15d and exhausted from the slits 15c after passing through the gap G. In the present embodiment, as illustrated in FIG. 5, the circumferential length M of the partition plates 110 is set at about 164 mm. Accordingly, the partition plates 110 bypass the process gas moved into the exhaust space V so that the process gas is exhausted from the slits 15c after passing through the gap G by about 164 mm.

Descriptions will now be made on the purpose of forming the slits 15c. For example, in the case where the exhaust mechanism 100 is common to the plurality of processing spaces S as in the wafer processing apparatus 1 of the present embodiment, for the purpose of preventing interference of the process gas between the respective processing spaces S, it is preferable to reduce the size of the slits 15c as far as possible and to prevent the process gas from flowing from the outside of the processing spaces S into the processing spaces S. In an effort to set the optimal dimension of the slits 15c in the inner wall 15 having the slits 15c, the present inventors have conducted a test in which a change in the pressure in the processing spaces S and a change in the concentration of the process gas in the processing spaces S are confirmed by supplying different process gases into one of the processing spaces S and the other processing space S and by changing the dimension of the slits 15c. In this test, the partition plates 110 are not installed in the inner wall 15.

As a result of the test, it was found that if the opening area of the slits 15c is made smaller, the concentration of the process gas becomes higher. That is to say, the amount of the process gas drifting over from the other processing space S into the one of the processing spaces S becomes smaller. However, the pressure in the processing spaces S becomes higher. It was also found that if the amount of the process gas drifting over is reduced to a desired value, the pressure in the processing spaces S could not satisfy the value required for wafer processing. That is to say, if the opening area of the slits 15c is made small, the pressure loss in the slits 15c increases. The amount of the process gas drifting over and the pressure in the processing spaces S are in a tradeoff relationship.

Thus, the inventors have extensively studied a method of reducing the amount of the process gas drifting over while suppressing the pressure loss in the slits 15c and have found that, by increasing the length of an exhaust route within the inner wall 15, it is possible to reduce the amount of the process gas drifting over while suppressing the increase in the pressure loss to a minimum level. The present disclosure is based on this finding. Thus, in the present embodiment, the partition plates 110 are installed on the inner surface of the inner wall 15 to thereby form a gap G between the body portion 15a and the partition plates 110. The process gas existing within the exhaust space V is introduced through the slit inlet 15d and exhausted from the slits 15c via the gap G. Consequently, the exhaust route is made longer just as much as the circumferential length of the gap G.

The wafer processing apparatus 1 according to the present embodiment is configured as described above. Next, descriptions will be made on the processing of the wafers W in the wafer processing apparatus 1.

In the wafer processing, as illustrated in FIG. 3, the partition wall 14 is first moved down to the retracted position. In this state, the wafers W are transferred into the processing container 10 by the transfer mechanism (not illustrated) installed outside the wafer processing apparatus 1 and are mounted on the mounting stands 11 and 12.

Thereafter, as illustrated in FIG. 1, the partition wall 14 is moved up to the wafer processing position. Thus, the processing spaces S are formed by the partition wall 14.

Then, at a predetermined time, the interior of the processing container 10 is evacuated to a predetermined pressure by the exhaust mechanism 100. The process gas is supplied from the gas supply source 34 into the processing container 10. A predetermined process, for example, a COR process in the present embodiment, is performed to the wafers W.

In the COR process, the process gas supplied from the gas supply source 34 is supplied to the wafers W via the shower plates 32. Since the partition wall 14 is installed so as to surround the mounting stands 11 and 12, the process gas supplied from the shower plates 32 is uniformly supplied to the wafer plane.

The process gas existing within the processing spaces S is discharged from the exhaust mechanism 100 via the exhaust spaces V and the slits 15c of the inner walls 15. At this time, the partition plates 110 bypass the process gas so that the process gas is exhausted after passing through the gap G between the partition plates 110 and the inner walls 15 in the exhaust spaces V. It is therefore possible to reduce the amount of the process gas drifting over via the slits 15c of the inner walls 15 to a minimum level while keeping the internal pressure of the processing spaces S depressurized to a desired vacuum degree. Thus, there is no possibility that the process gases existing in the respective processing spaces S interfere with each other.

After performing the COR process, the partition wall 14 is moved down to the retracted position. The wafers W mounted on the mounting stands 11 and 12 are unloaded to the outside of the wafer processing apparatus 1 by the wafer transfer mechanism (not illustrated). Thereafter, the wafers W are heated by a heating device installed outside the wafer processing apparatus 1. The reaction product generated by the COR process is vaporized and removed. Thus, a series of wafer processing is completed.

According to the embodiment described above, the partition wall 14 and the inner walls 15 are configured to independently surround the mounting stands 11 and 12. This makes it possible to independently form the processing spaces S with respect to the mounting stands 11 and 12. Furthermore, the process gas existing within the processing spaces S is exhausted from the slits 15c of the inner walls 15. This makes it possible to secure gas flow uniformity for each of the wafers W and to process the wafers W having in-plane uniformity.

Moreover, the partition plates 110 which bypass the process gas existing within the processing spaces S so as not to directly flow into the slits 15c are installed in the inner walls 15. Therefore, as compared with a case where the partition plates 110 are not installed, the exhaust route of the process gas within the inner walls 15 becomes longer. By doing so, the process gas is difficult to enter the interior of the inner walls 15 from the outside while reducing the increase in the pressure loss in the exhaust route to a minimum level. As a result, it is possible to prevent the process gases existing in the respective processing spaces S from interfering with each other. This makes it possible to independently perform the processing of each of the wafers W with in-plane uniformity.

In the embodiment described above, the partition plates 110 are formed in an arc shape so as to extend along the body portion 15a of each of the inner walls 15. However, the shape of the partition plates 110 is not limited to that of the present embodiment but may be arbitrarily set as long as the exhaust route in the exhaust spaces V can be made longer. That is to say, the partition plates 110 need not be necessarily formed in an arc shape but may have, for example, a rectilinear shape.

In the embodiment described above, the inner wall 15 is installed lower than the mounting surface of the mounting stand 11. However, the vertical length of the partition wall 14 and the inner wall 15 may be arbitrarily set. That is to say, as an alternative example, the upper end portion of the inner wall 15 may be positioned higher than the mounting surface of the mounting stand 11 as long as it is possible to appropriately form the processing space S and to gain access to the wafer W when the partition wall 14 is moved to the wafer processing position and the retracted position. However, from the viewpoint of maintaining the uniformity of a gas flow within the processing space S, it is preferred that the structure affecting the gas flow is not installed higher than the mounting surface of the mounting stand 11 as far as possible. For that reason, it is preferred that the slits 15c and the partition plates 110 are disposed lower than the mounting surface of the mounting stand 11.

In the embodiment described above, two mounting stands 11 and 12 are installed as a plurality of mounting stands. However, the number of the mounting stands installed is not limited to that of the present embodiment. By the plurality of mounting stands, it is meant that there is provided a plurality of mounting surfaces. For example, it is to be understood that a mounting stand configured to mount a plurality of wafers W thereon falls within the scope of the plurality of mounting stands.

In the embodiment described above, one partition wall 14 is installed with respect to the plurality of mounting stands 11 and 12. However, the configuration of the partition wall 14 is not limited to that of the present embodiment. The shape of the partition wall 14 may be arbitrarily set as long as independent processing spaces S can be formed with respect to the mounting stands 11 and 12. For example, partition walls each having only one cylinder portion 40 may be independently installed with respect to the mounting stands 11 and 12.

In the embodiment described above, the processing spaces S are formed by bringing the partition wall 14 and the frame 31 into contact with each other. However, the member with which the partition wall 14 makes contact in order to form the processing spaces S is not limited to the frame 31. For example, the processing spaces S may be formed by bringing the partition wall 14 into contact with the top plate 21.

While the aforementioned embodiment has been described by taking, as an example, a case where the COR process is performed to the wafers, the present disclosure may be applied to other wafer processing apparatuses using a process gas, for example, a plasma processing apparatus.

According to the present disclosure in some embodiments, it is possible to independently process a plurality of substrates with in-plane uniformity within a processing container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for processing substrates, comprising:
   a processing container configured to air-tightly accommodate the substrates;
   a plurality of mounting stands configured to mount the substrates within the processing container;
   a process gas supply part configured to supply a process gas from above the mounting stands toward the mounting stands;
   an exhaust mechanism configured to evacuate an interior of the processing container;
   a partition wall disposed within the processing container and configured to independently surround the mounting stands with a gap left between the partition wall and an outer periphery of each of the mounting stands;
   an elevator mechanism configured to move the partition wall up and down between a retracted position and a substrate processing position; and
   cylindrical inner walls disposed on a bottom surface of the processing container and configured to independently surround the mounting stands with a gap left between each of the inner walls and the outer periphery of each of the mounting stands,
   wherein substrate processing spaces are formed by the partition wall and the inner walls as the partition wall is moved to the substrate processing position,
   wherein each of the inner walls includes a plurality of process gas exhaust passages,
   wherein each of process gas exhaust passages includes an interior slit inlet through which the process gas existing within the processing space is initially exhausted from the processing space, a channel connected to the interior slit inlet and formed between a body portion of the inner wall and a partition plate formed on an inner surface of the inner wall, the channel configured to guide the process gas by a predetermined length, and an exterior slit outlet through which the process gas is finally exhausted from the processing space, the exterior slit outlet connected to the channel,
   wherein the inner walls are disposed lower than substrate mounting surfaces of the mounting stands, and
   wherein the interior slit inlet and the exterior slit outlet are separated from each other in the circumferential direction of the inner wall with the channel being interposed between the interior slit inlet and the exterior slit outlet, the channel being formed in a circumferential direction of the inner wall, so that a cross section of the channel through which the process gas flows is perpendicular to cross sections of the interior slit inlet and the exterior slit outlet through which the process gas flows.

2. The apparatus of claim 1, wherein the exterior slit outlets are formed at regular intervals on side surfaces of the inner walls.

3. The apparatus of claim 2, wherein the partition plates have an arc shape parallel to inner surfaces of the inner walls.

* * * * *